(12) United States Patent
Ahsan

(10) Patent No.: US 6,822,341 B1
(45) Date of Patent: Nov. 23, 2004

(54) LATENT CATALYSTS FOR MOLDING COMPOUNDS

(75) Inventor: Tanweer Ahsan, Olean, NY (US)

(73) Assignee: Henkel Corporation, Rocky Hill, CT (US)

( * ) Notice: Subject to any disclaimer, the term of this patent is extended or adjusted under 35 U.S.C. 154(b) by 41 days.

(21) Appl. No.: 10/325,813

(22) Filed: Dec. 19, 2002

(51) Int. Cl.$^7$ .................. H01L 23/29; C08G 59/38; C08L 63/00; B01J 31/02; B01J 32/00

(52) U.S. Cl. ............... 257/793; 502/150; 502/162; 502/167; 502/232; 502/300; 523/400; 523/440; 523/443; 523/466; 523/210; 523/211; 523/216; 528/93; 528/408

(58) Field of Search .............. 528/93, 408; 523/400, 523/440, 443, 466, 210, 211, 216; 428/402, 403; 427/212, 220; 257/793; 502/150, 162, 167, 232, 300

(56) References Cited

U.S. PATENT DOCUMENTS

| | | | | |
|---|---|---|---|---|
| 3,245,946 A | * | 4/1966 | O'Connor et al. | 523/211 |
| 4,066,625 A | | 1/1978 | Bolger | |
| 4,396,754 A | * | 8/1983 | Brownscombe | 528/89 |
| 5,218,111 A | * | 6/1993 | Scholl | 540/202 |
| 5,362,775 A | * | 11/1994 | Shintai et al. | 523/451 |
| 5,430,112 A | * | 7/1995 | Sakata et al. | 525/526 |
| 5,705,540 A | * | 1/1998 | Uchida et al. | 523/210 |
| 5,908,882 A | * | 6/1999 | Togashi et al. | 523/443 |
| 6,084,037 A | | 7/2000 | Shimizu et al. | |
| 6,190,786 B1 | * | 2/2001 | Hirano et al. | 428/620 |
| 6,190,787 B1 | | 2/2001 | Maeda et al. | |
| 6,194,491 B1 | * | 2/2001 | Fujii et al. | 523/466 |
| 6,268,417 B1 | * | 7/2001 | Ozawa et al. | 524/100 |
| 6,372,839 B1 | * | 4/2002 | Ito et al. | 524/493 |
| 6,432,540 B1 | | 8/2002 | Gallo | |
| 6,437,026 B1 | | 8/2002 | Garrett | |
| 6,458,472 B1 | | 10/2002 | Konarski et al. | |
| 6,492,438 B1 | * | 12/2002 | Nomura | 523/466 |
| 6,555,187 B1 | * | 4/2003 | Kitamura | 428/1.53 |

* cited by examiner

Primary Examiner—Jeffrey B. Robertson
(74) Attorney, Agent, or Firm—Webb Ziesenheim Logsdon Orkin & Hanson P.C.

(57) ABSTRACT

A latent catalyst particularly useful in epoxy molding compositions for use in electronic packaging materials is provided. The latent catalyst is in the form of a curative represented by a combination of an inorganic-based carrier having an activated surface and a catalyst compound including a moiety capable of accelerating curing of the epoxy resin, such as the reaction product of silica and 1,8-diazobicyclo(5.4.0)undecene-7 (DBU). The activated surface of the inorganic-based carrier includes reactive surface groups capable of bonding to the moiety through a hydrogen bond, and also includes a high surface area porous surface, such that the catalyst compound is sorbed on the activated surface. The invention further provides epoxy compositions including the curative with an epoxy resin and a curing agent for the epoxy resin, which compositions are particularly useful as molding powders for semiconductors with prolonged shelf life stability.

43 Claims, No Drawings

LATENT CATALYSTS FOR MOLDING COMPOUNDS

BACKGROUND OF THE INVENTION

1. Field of the Invention

The present invention relates to catalysts for molding compounds. More particularly, the present invention relates to latent catalysts for epoxy molding compositions, which are particularly useful as encapsulants for electronic packaging materials.

2. Brief Description of Related Technology

Epoxy resin compositions are widely used for electronic packaging materials in the electronics industry, and, in particular, as encapsulants for semiconductor elements and electronic circuits. Compositions used as electronic packaging materials must have high reliability including excellent thermal cycle resistance due to extensive temperature changes encountered through typical use of electronic devices. For example, assembly of electronic components typically involves exposure of the electronic component to high temperatures to achieve solder reflow for establishing electrical interconnection between a chip and a substrate, as well as to achieve proper curing of any polymeric material which may be used as an underfill material between the chip and the substrate or as an adhesive for adhering the chip to the substrate.

Accordingly, epoxy resin based compositions, and, in particular, cresol novolac-type epoxy compositions, have been widely used in the formation of molding compositions for use as electronic packaging materials. Such epoxy resin based compositions typically include an epoxy resin, a curing agent such as a phenolic hardener, and a bulk amount of a filler component, as well as other additives. In addition, curing catalysts are typically included within the composition for promoting reaction of the epoxy resin.

Recently, the trend in the industry is to develop molding compounds that can withstand higher solder reflow temperatures. For example, diphenyl oligomers are currently preferred over dianhydride oligomers and diamine oligomers due to higher reliability. Also, fast curing catalysts, such as tertiary amine compounds, tertiary phosphine compounds and their derivatives, are typically employed in epoxy molding compounds for improving productivity reliability and hot hardness strength properties. When molding compounds incorporate resins with higher reactivity, such as the more reactive diphenyl oligomers, the amount of curing catalyst included in the molding compound must be optimized to provide optimum curing of the resin. However, when the curing catalysts are provided at such optimum levels for reliability, the curable resins within the molding compound are more reactive at lower temperatures, such as during storage. Long term shelf life stability is therefore compromised due to an increase of viscosity of the composition from the higher reactivity at temperatures below the optimum curing temperature.

U.S. Pat. No. 6,084,037 to Shimizu et al. discloses an epoxy resin composition for use as an encapsulant for semiconductor devices. The composition includes an epoxy resin, a curing agent, and a filler, with a specific curing accelerator comprising a reaction product of trimellitic anhydride and 1,8-diazabicyclo(5.4.0)undecene-7 ("DBU"), and a mercapto-containing silane coupling agent. Introducing such components to form the curing accelerator, however, may impart undesirable characteristics to the finally cured composition.

U.S. Pat. No. 6,458,472 Bi to Konarski et al. discloses fluxing underfill compositions useful for fluxing metal surfaces in preparation for providing an electrical connection and sealing the space between semiconductor devices. The fluxing underfill compositions include an epoxy resin, an acidic fluxing agent and an anhydride, along with a latent curing agent complex of a salt of a nitrogen-containing component and a portion of the acidic fluxing agent.

Accordingly, it would be advantageous to provide a molding composition useful as an encapsulant for electronic packaging materials that provides the advantages of improved reactivity and reliability with long term shelf life stability, and which incorporates traditional compounds within the molding composition to achieve these properties.

SUMMARY OF THE INVENTION

It has been discovered through the present invention that epoxy compositions having prolonged shelf life can be achieved through the use of a latent curative. As such, the present invention is directed to a curative which is particularly useful for accelerating the cure of epoxy compositions. The curative includes a combination of an inorganic-based carrier having an activated surface, and a catalyst compound including a moiety capable of accelerating the cure of an epoxy composition, such as a nitrogen-containing compound or a phenyl-containing compound. The inorganic carrier is subjected to conditions to activate at least a portion of its surface, such as through a heat treatment to expose active groups, such as through the removal of labile water molecules. The activated surface of the inorganic-based carrier includes a high surface area porous surface, and may include reactive surface groups which are capable of bonding to the catalyst compound through a hydrogen bond. As such, a curative may be formed as a reaction product of the catalyst compound bonded with the inorganic carrier.

The present invention is further directed to a composition including the latent curative. In particular, the present invention is further directed to a composition which includes an epoxy resin, a curing agent for the epoxy resin, and a latent curative composed of a combination of an inorganic-based carrier having an activated surface and a catalyst compound including a moiety capable of accelerating curing of the epoxy resin. Desirably, the activated surface of the inorganic-based carrier includes reactive surface groups capable of bonding to the moiety through a hydrogen bond, and further includes a high surface area porous surface, such that the catalyst compound is sorbed on the activated surface.

Desirably, the curative includes an inorganic-based carrier of silica reacted with either a phenyl-containing catalyst compound such as triphenyl phosphine or, more desirably, a nitrogen-containing catalyst compound such DBU. The epoxy resin and the curing agent are desirably highly reactive components, such as bisphenol-based epoxies and cresol-based hardeners.

The compositions or the present invention when cured are particularly useful as electronic packaging materials, and may therefore also include a bulk amount of a filler as well as other components conventionally used in such compositions.

In a further embodiment, the present invention is directed to a process for preparing a curative for an epoxy resin. The process involves activating the surface of an inorganic-based carrier, such as by removing water from the surface, for example through heating the surface under vacuum. The inorganic-based carrier is then combined with a catalyst compound having reactive moieties such that at least a portion of the moieties in the catalyst compound are deactivated. The material is then dried, thereby forming the latent curative. The reactive moieties of the catalyst compound may be deactivated through bonding with the inorganic-based carrier through a hydrogen bond to form a complex. Desirably, the catalyst compound is a nitrogen-containing catalyst compound, with at least a portion of the nitrogen atoms of the nitrogen-containing catalyst being bonded to the inorganic-based carrier through a hydrogen bond, thus forming an acid-base complex.

DETAILED DESCRIPTION OF THE INVENTION

The present invention is directed to a molding composition, and, in particular, to a molding composition for use in electronic packaging materials. Traditional molding compositions for use as electronic packaging materials include an epoxy component, a curing agent for the epoxy component, a curing catalyst for accelerating the cure, and a bulk amount of a filler material. The molding composition of the present invention includes a latent curative represented by a combination of a catalyst compound and an inorganic-based carrier. As such, the present invention is directed to the curative specifically designed for accelerating the cure of an epoxy resin, as well as to epoxy compositions including the curative in combination with an epoxy resin and a curing agent for the epoxy resin.

The epoxy resin component may be any type of epoxy resin useful in molding compositions, including any material containing two or more reactive oxirane groups. The epoxy resin may have two or more epoxy groups in one molecule. The epoxy resin may be selected from phenol type epoxy resins; novolac type epoxy resins; alicyclic type epoxy resins; glycidyl ether type epoxy resins; glycidyl-ester type epoxy resins; biphenyl type epoxy resins; polyfunctional type epoxy resins; heterocyclic type epoxy resins; naphthalene ring-containing epoxy resins; cyclopentadiene-containing epoxy resins; halogenated epoxy resins, and mixtures and combinations thereof. Non-limiting examples of suitable epoxy resins include bisphenol-A-type epoxy resin, epoxy cresol novolac resin, phenolic novolac epoxy resin, biphenyl epoxy resin, hydroquinone epoxy resin, stilbene epoxy resin, and mixtures and combinations thereof. Epoxy cresol novolac resin is particularly desirable for use in the present invention. The epoxy resins may be used either individually or as a mixture of two or more resins, such as a combination of epoxy cresol novolac and biphenyl epoxy resin.

Specific examples of the useful epoxy resin include bisphenol-A-type epoxy resin (such as RE-310-S from Nippon Kayaku, Japan, or "EPON" 828 or "EPON" 1002f from Shell Chemical Co.), bisphenol-F-type epoxy resin (such as RE-404-S from Nippon Kayaku, Japan), phenol novolac-type epoxy resin, and cresol novolac-type epoxy from resin (such as "ARALDITE" ECN 1871 from Ciba Specialty Chemicals, Hawthorne, N.Y.).

Other suitable epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Among the epoxy resins suitable for use herein also include polyglycidyl derivatives of phenolic compounds, such as those available commercially under the tradename "EPON", such as "EPON" 1031 from Shell Chemical Co.; "DER" 331, "DER" 332, "DER" 334, and "DER" 542 from Dow Chemical Co.; and "BREN-S" from Nippon Kayaku, Japan. Other suitable epoxy resins include polyepoxides prepared from polyols and the like and polyglycidyl derivatives of phenol-formaldehyde novolacs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals. SU-8 is believed to be a cresol novolac epoxy available from Interez, Inc. Polyglycidyl adducts of amines, aminoalcohols and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals and PGA-X and PGA-C from the Sherwin-Williams Co. Copolymers of epichlorohydrin and bisphenol A as well, such as "EPON" 1001 and "EPON" 1009 from Shell Chemical Co., may be used.

And of course combinations of the different epoxy resins are also desirable for use herein.

A curing agent component is provided for promoting curing/crosslinking of the epoxy resin to form a polymer composition. The curing agent is a resin hardener, desirably including a phenol-derived or substituted phenol-derived novolac or an anhydride. Non-limiting examples of suitable hardeners include phenol novolac hardener, cresol novolac hardener, dicyclopentadiene phenol hardener, limonene type hardener, anhydrides, and mixtures thereof. Phenol novolac hardener is particularly desirable. Also, in a similar manner as with the epoxy resins, the resin hardener may be used either individually or as a mixture of two or more hardeners.

In desirable embodiments including a phenol novolac hardener, the phenol novolac hardener desirably contains a biphenyl or naphthyl moiety. The phenolic hydroxy groups can be attached to the biphenyl or naphthyl moiety of the compound. A preferred phenol novolac hardener is commercially available from Meiwa Plastic Industries, Ltd. of Japan (catalog no. MEH 7851, SS graded). This type of hardener may also be prepared according to the methods described in EP 915 118 A1. For example, a hardener containing a biphenyl moiety can be prepared by reacting phenol with bismethoxy-methylene biphenyl.

The curative component promotes reaction between the epoxy resin and the resin hardener during curing of the molding composition. In traditional epoxy molding compositions, a catalyst compound is incorporated directly into the composition with the epoxy resin and the resin hardener. However, when the catalyst compound is present in an amount which is optimal for providing the molding compound with desirable moldability and hot hardness strength properties, the epoxy resin is more reactive at lower temperatures due to the catalyst compound, particularly with the more reactive epoxy resins. This low-temperature reactivity of the epoxy resin reduces the shelf life stability of the molding composition.

It has been unexpectedly discovered through the present invention that a traditional catalyst compound can be combined with an inorganic-based carrier to produce a curative, in which the catalyst compound remains deactivated until heated during the molding of the composition. In this manner, the curative of the present invention is a latent curing catalyst, which includes materials capable of catalyzing or accelerating the polymerization of the epoxy resin component once a triggering event occurs, such as a certain temperature is reached.

The latent curative of the present invention of the present invention represents a combination of an inorganic-based carrier having an activated surface, and a catalyst compound including a moiety capable of accelerating curing of the epoxy resin. It is contemplated that at least a portion of the moieties of the catalyst compound may interact with reactive surface groups which have been exposed on the surface of the inorganic carrier. As such, in one embodiment of the present invention, the curative may represent a complex formed as a reaction product of the inorganic carrier and the catalyst compound.

Since the curative of the present invention is particularly useful for epoxy molding compositions, the inorganic-based carrier component is desirably a compound which is compatible with epoxy compositions. Any inorganic compound can be used as the inorganic-based carrier, provided that the carrier includes or is modified to include an activated surface. For purposes of the present invention, the phrase "activated surface" represents a surface which includes or is modified to include reactive surface groups and/or a porous surface. The inorganic-based carrier is a high surface area material, desirably having a surface area of 200–1000 m²/g, more desirably 200–600 m²/g, and more desirably 200–300 m²/g. Nano scale fillers, such as those having a surface area ranging from about 500–1000 m²/g, are also useful in the present invention. Materials which have traditionally been used as bulk filler materials in epoxy compositions have been discovered as being particularly useful as carriers for the catalyst compound. Non-limiting examples of materials useful as the inorganic-based carrier include silica, alumina, aluminosilicates (whether naturally occurring or synthetic), aluminum trihydrate, silicon nitride, clay, talc, mica, kaolin, calcium carbonate, wollastonite, montmorillonite, smectite, and combinations thereof. In particularly desirable embodiments, the inorganic-based carrier is activated silica.

The catalyst compound may be any catalyst which is known for promoting reaction between the epoxy resin and the hardener. Desirably, the catalyst compound is a nitrogen-containing compound, a phenyl-containing compound, or a mixture or combination thereof. The nitrogen-containing compound may be an amine compound, an amide compound, an imidazole compound, or a mixture or combination thereof that is capable of initiating (accelerating) the cure of an epoxy formulation.

Examples of the amine compounds include aliphatic polyamines, such as the di- or tri-aza compounds:

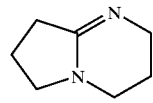

1,5-diazabicyclo[3.4.0]non-ene;

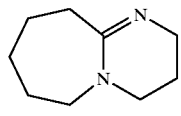

DBU;

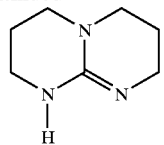

1,5,7-triazabicyclo[4.4.0]dec-5-ene;

the bicyclo mono- and di-aza compounds:

quinuclidine;

1,4-diazabicyclo[2.2.2]octane;

the alkyl polyamines:
diethylenetriamine, triethylenetriamine, diethylaminopropylamine, isophoronediamine and menthenediamine; and
the aromatic polyamines:
m-xylenediamine, diaminodiphenylamine, and quinoxaline.

Of course, combinations of these amine compounds are also desirable for use in the compositions of the present invention.

Aromatic polyamines and alicyclic polyamines are also desirable, particularly 4,4'-methylenedianiline ("MDA") 4,4'methylenebis(cyclo-hexylamine) ("MCA"), benzyl di-methylamine (BDMA) and 2,4,6-tris(methyl di-methylamine) phenol. Of course, combinations of these amine compounds are also desirable for use in the present invention.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-undecylimidazole, 2-heptadecylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanamrinoethyl-2-methylimidazole and addition products of an imidazole and trimellitic acid and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ and from Synthron, Inc., Morganton, N.C. under the trade designation "ACTIRON" NXJ-60; and from Borregaard Synthesis, Newburyport, Mass. under the trade designation "CURIMID CN".

Of course, combinations of these imidazole compounds are also desirable for use in the present invention.

Examples of phenyl-containing compounds include triphenyl phosphine ("TPP").

As will be described in more detail herein, the inorganic-based carrier and the catalyst compound are combined to form the curative. Desirably, the curative includes from about 60 to about 90 weight percent of the inorganic-based carrier, and from about 10 to about 40 weight percent of the catalyst compound, based on the weight of the curative. More desirably, the curative includes from about 80 to about 90 weight percent of the inorganic-based carrier and from about 10 to about 20 weight percent of the catalyst compound, based on the weight of the curative.

The curative is then further combined with an epoxy resin and a curing agent for the epoxy resin to form a curable composition in accordance with a further embodiment of the present invention. A bulk amount of a filler component may further be added, particularly in embodiments in which the epoxy curable composition is provided as a molding composition, such as in the form of a molding powder for electronic applications. The filler component or filler material may be any material known in the art for use as a filler material. Non-limiting examples of materials useful as the filler component include silica, alumina, aluminosilicate, aluminum trihydrate, silicon nitride, clay, talc, mica, kaolin, calcium carbonate, wollastonite, montmorillonite, smectite, and combinations thereof. While the filler component and the inorganic-based carrier of the curative may be independently selected from similar materials, desirably they are the same material. In particularly desirable embodiments, both the filler component and the inorganic-based carrier are silica.

The filler material is desirably present in the molding composition of the present invention in a bulk amount, therefore representing a substantial portion or majority component of the molding composition. The amount of the filler material in the molding composition ranges from about 50 weight percent to about 95 weight percent based on the total weight of the molding composition, desirably from about 70 weight percent to about 80 weight percent based on the total weight of the molding composition. The epoxy resin component represents from about 5 weight percent to about 20 weight percent of the molding composition, desirably from about 10 weight percent to about 15 weight percent of the molding composition. The amount of the curing agent or resin hardener in the molding composition ranges from about 1.5 weight percent to about 10 weight percent based on the total weight of the molding composition, desirably about 5 weight percent to about 7 weight percent of the molding composition. The amount of the curative in the molding composition ranges from about 0.1 weight percent to about 10 weight percent, desirably about 0.5 to about 1 weight percent.

The molding composition may further include a small amount of additional catalyst compound in "free" form, i.e., not combined or complexed with an inorganic-based carrier. The additional catalyst in free form is desirably the same catalyst compound which is combined and/or reacted with the inorganic-based carrier to form the curative, albeit at a small amount, such as from about 0.01 weight percent to about 0.1 weight percent. This additional catalyst compound in free form, when included, is provided in such a small amount that it does not significantly alter the curing profile of the epoxy resin and does not significantly affect the shelf life stability of the composition.

Moreover, the molding composition of the present invention may include additional components and additives known to impart specific properties to the molding composition, depending on the intended application of the product. For example, the molding composition may include a component selected from mold release agents, coupling agents, colorants, flame retardants, ion scavengers, and mixtures thereof.

Mold release agents are chemical agents commonly used to assist in the release of the cured epoxy molding compounds from the curing mold. Examples of useful mold release agents include carnauba wax, montanic acid ester wax, polyethylene wax, polytetrafluoroethylene wax, glyceral monostearate, metallic stearates, paraffin wax, and the like. The mold release agent may be provided in an amount of from about 0.1 weight percent to about 2 weight percent based on the total weight of the molding composition.

Coupling agents are known to improve the dry electrical properties of compounds. Examples of useful coupling agents include silane-type coupling agents, characterized by the formula $R'Si(OR)_3$, where R' represents an organo-funtional group such as amino, mercapto, vinyl, epoxy or methacryloxy, and OR represents a hydrolyzable alkoxy group attached to the silicon. The coupling agent may be provided in an amount of from about 0.1 weight percent to about 2 weight percent based on the total weight of the molding composition.

Examples of useful colorants include carbon black, pigments, dyes, and the like. The colorant may be provided in an amount of from about 0.1 weight percent to about 2 weight percent based on the total weight of the molding composition.

Examples of useful flame retardants include bromine-containing flame retardants, phosphorus-containing flame retardants, antimony oxide flame retardants, and the like. The flame retardant may be provided in an amount of from about 1 weight percent to about 5 weight percent based on the total weight of the molding composition. In addition, bromine-free flame retardants, commonly referred to as "green compounds", may also be used. See for example U.S. Pat. Nos. 6,432,540 to Gallo and 6,190,787 to Maeda et al.

Examples of useful ion scavengers include magnesium aluminum carbonate hydrate. The ion scavenger may be provided in an amount of from about 0.1 weight percent to about 2 weight percent based on the total weight of the molding composition.

The present invention will now be described in terms of a method of preparation. The inorganic-based carrier and the catalyst compound are combined to form the curative. In particular, the high surface area carrier is initially activated. This may be accomplished by thermally activating the inorganic-based carrier, such as high surface area silica, by heat drying under vacuum at elevated temperatures such as at least about 100° C., desirably about 200–400° C., for a period of at least about 1 hour, desirably for about 4–8 hours. Activation of the surface in this manner is believed to remove at least a portion of any labile water molecules present on the surface of the carrier. The activated carrier thus exhibits a weight loss, which is desirably up to about 5%, and typically about 1–2%. The thus activated carrier is then cooled to room temperature, and is combined with the catalyst compound, desirably in a non-polar solvent, such as hexane. The material is then filtered, washed with solvent, and subsequently dried in a dessicator, thereby producing the curative.

The combination of the inorganic carrier and the catalyst compound provides a latent curative which is capable of accelerating reaction of the resin under the appropriate conditions for curing of the resin, such as during heat curing, without causing a significant increase in the viscosity of the resin prior to exposure to the these curing conditions, such as during storage of the composition. The latent reactivity of the curative is achieved through at least partially deactivating the active moiety of the catalyst compound. This deactivation may be achieved, for example, through the formation of an acid-base complex through chemical and/or physical bonding between the inorganic carrier and the catalyst compound. For example, when silica is used as the inorganic-based carrier, the surface of the silica is activated to remove labile molecular water. This activation imparts reactivity to the surface of the silica, providing reactive groups that can bond with a reactive moiety on the catalyst compound through a hydrogen bond. In this manner, it is contemplated that the curative may be represented by a catalyst complex formed as the reaction product of the inorganic-based carrier and the catalyst compound.

In addition, the inorganic-based carrier has a high surface area which is porous, including voids and pores throughout the surface. It is contemplated that the catalyst compound may also be physically sorbed directly onto the surface of the carrier and trapped within these voids and pores throughout the surface. Heating of the curative further causes release of the catalyst compound from entrapment within these voids and pores. As such, the latent reactivity of the curative may be provided through a dual mechanism, in which the catalyst compound is chemically bonded to the activated surface of the carrier through hydrogen bonding to form an acid-base complex, and in which the catalyst compound is physically sorbed within the pores and voids of the porous surface of the carrier.

The curative is more stable at lower temperatures than the catalyst compound in its free form, such as at room temperature and under typical low temperature storage conditions of 4–6° C. Moreover, the curative slowly releases the catalyst compound when heated. This may be accomplished, for example, by cleavage of the hydrogen bond between the active moiety of the catalyst compound and the activated surface of the carrier when the curative is heated to temperatures sufficient for epoxy curing, such as between about 100–250° C. In this manner, the active moiety of the catalyst compound is released for reaction with the epoxy resin, and/or the catalyst compound that is physically entrapped within the pores and voids is also released. As such, the curative acts as a latent catalyst which remains stable at low temperatures such as typical storage conditions, and which releases the active agent, such as an amine base, when heated under normal processing conditions.

Moreover, by providing the inorganic-based carrier as a compound which is typically incorporated into molding compositions as a filler material, such as silica, the carrier does not adversely effect the molding composition after release of the catalyst compound, and is incorporated directly into the composition as additional filler.

To provide a molding composition, the thus-prepared curative can be used in place of a traditional amount of curing catalyst provided in free form as in conventional molding compositions. For example, the curative can be combined and mixed with an epoxy resin, an epoxy hardener curing agent, and a bulk amount of a filler material, such as silica. Other known components such as coupling agents, mold release agents and any additional additives can also be provided in known manner in appropriate proportions as set forth above. Mixing of the components may be accomplished, for example, with a differential roll mill or with an extruder, to produce a uniform sheet, which is subsequently cooled and ground into a fine powder. The powder may be used as is as a final molding powder composition, or may be densified or compacted in known manner to form preforms of pellets or tablets of desired shape or size.

The thus formed molding composition may be molded into various articles by application of the appropriate temperature and pressure. For example, typical molding conditions may range from about 150° C. to about 200° C., desirably about 175° C. to about 190° C., at pressures of from about 400 to about 1,500 pounds per square inch (psi) (about 28–105 kg/cm$^2$), for a time ranging from about 30 to 120 seconds, desirably 60 to 90 seconds. Such conditions result in proper reaction and curing of the epoxy composition to form the electronic packaging material of the present invention, such as for an encapsulated semiconductor.

The molding compositions may be used to encapsulate semiconductor devices by any conventional method. Any suitable molding apparatus may be employed, such as a transfer press equipped with a multi-cavity mold.

The present invention will be further exemplified through the following examples, which demonstrate the preparation of molding compositions of the present invention, as well as comparisons of such coatings with prior art compositions. Unless otherwise indicated in the examples and elsewhere in the specification and claims, all parts and percentages are by weight, temperatures are in degrees Centigrade, and pressures are at or near atmospheric pressure.

EXAMPLES

Synthesis Example

This Example demonstrates the preparation of a curative in accordance with the present invention.

85 grams of high surface area (200–600 m$^2$/g) silica commercially available from Degussa was thermally activated by drying at 200–400° C. under vacuum for 4–8 hours. The dried silica was cooled to room temperature. The dried silica was then combined with 15 grams of DBU (an amine catalyst available from Air Products), in about 250 mls of a non-polar solvent such as hexane. The thus prepared material was filtered off and washed with several aliquots of hexane to produce a silica-DBU catalyst curative. The curative was subsequently dried overnight in a dessicator, forming an 85% silica-15% DBU catalyst curative.

Examples 1–5

A series of formulations for molding compositions were prepared including the following components:

TABLE 1

| COMPONENT TYPE | SAMPLE NO. | | | | |
| --- | --- | --- | --- | --- | --- |
| | 1* | 2 | 3 | 4 | 5 |
| Epoxy Cresol Novolac Resin | 8.56 | 8.56 | 8.56 | 8.56 | 8.56 |
| Phenolic Novolac Hardener | 5.52 | 5.52 | 5.52 | 5.52 | 5.52 |

TABLE 1-continued

| COMPONENT | SAMPLE NO. | | | | |
|---|---|---|---|---|---|
| TYPE | 1* | 2 | 3 | 4 | 5 |
| Silica/DBU Catalyst Curative (from Synthesis Example above) | 0 | 1 | 1 | 1 | 1 |
| Free DBU Catalyst | 0.14 | 0.05 | 0.07 | 0.08 | 0.09 |
| Fused Silica Filler | 80.7 | 79.79 | 79.77 | 79.76 | 79.75 |
| Silane Coupling Agent | 0.7 | 0.7 | 0.7 | 0.7 | 0.7 |
| Carnauba-Type Wax Mold Release Agent | 0.95 | 0.95 | 0.95 | 0.95 | 0.95 |
| Carbon black, flame retardant, ion scavenger | 3.4 | 3.4 | 3.4 | 3.4 | 3.4 |
| Adhesion Promoter | 0.03 | 0.03 | 0.03 | 0.03 | 0.03 |
| TOTAL | 100 | 100 | 100 | 100 | 100 |

*Comparative

These samples were prepared as follows. The silane coupling agent, the wax mold release agent and the additives were initially added to the silica filler in a Mixaco blender and blended for a period of 1 to 2 minutes. The epoxy resin, the hardener, and the catalyst were then added to the blended mixture of the silica filler, and milled using a two-roll mill at 210° F. The end product was pelletized using a Karas Corporation pelletizer to form the respective epoxy molding compositions.

The molding composition was transfer molded on a Lawton compression molding press at 177° C. under 0.5 ton.

Molded specimens of each of the compositions prepared in Sample Nos. 1–5 were prepared and tested for hot-plate gel time using a gel plate set at 177° C.; for spiral flow using ASTMD-3123 test method, in which the molding compound is flowed through a spiral semi-circular cross-section until the flow ceases; for hot hardness using ASTM D2240-02 test method, which is based on the penetration of a special type of indentor when forced into a material under specified conditions; and for moisture uptake by gravimetric method after subjecting the molded materials to JEDEC (Joint Electron Devices Engineering Counsel) level 1 testing, which requires the materials to be exposed to 85° C. and 85% relative humidity for a period of 168 hours. The results are shown in Table 2.

TABLE 2

| Sample No. | Hot plate Gel Time (sec) | Initial Spiral Flow (inches) | Spiral Flow After 70 days storage at 5 ° C. (inches) | Hot Hardness at 90 sec cure time | Moisture Uptake (%) |
|---|---|---|---|---|---|
| 1* | 28 | 39.5 | 33 | 83 | 0.3308 |
| 2 | 35 | 39 | 38 | 82 | 0.3422 |
| 3 | 30 | 35.5 | 34 | 83 | 0.3460 |
| 4 | 28 | 32.5 | 31 | 84 | 0.3386 |
| 5 | 26 | 31 | 30 | 84 | 0.3329 |

*Comparative

As can be seen from the results of Table 2, the molding compounds prepared with inventive Sample Nos. 2–5 including the silica/BDU catalyst curative have hot plate gel times, hot hardness strengths and moisture uptake values which are comparable to a traditional molding compound prepared with Sample No. 1. A comparison of the change in spiral flow for the molding compounds prepared with inventive Sample Nos. 2–5 and the molding compound prepared with comparative Sample No. 1 shows a dramatic decrease in spiral flow after cold storage for 70 days for the comparative molding compound, while the inventive molding compounds had only very slight changes in spiral flow. These results demonstrate the improved shelf life stability of the inventive molding compositions including the catalyst curative, due to a lower reactivity after prolonged storage. Moreover, a comparison of each of the molding compounds prepared with inventive Sample Nos. 2–5 demonstrates that increasing the amount of free catalyst in the molding compositions (with the amount of free catalyst still below that of comparative Sample No. 1) reduces the spiral flow but the shelf stability is unexpectedly maintained as evidenced by the insignificant change in the respect spiral flows after 70 days of storage at 5° C.

The foregoing examples are intended to illustrate, without limitation, the molding compositions and methods of the present invention.

What is claimed is:

1. A composition comprising:
   a) an epoxy resin;
   b) a curing agent for the epoxy resin; and
   c) a latent curative complex comprising:
      i) an inorganic carrier, at least a portion of whose surface has been activated, and
      ii) a catalyst including a moiety capable of accelerating curing of the epoxy resin, said moiety being at least partially deactivated through combination of the catalyst with the inorganic carrier having an activated surface.

2. A composition as in claim 1, wherein the activated surface of the inorganic carrier includes reactive surface groups capable of bonding to the moiety through a hydrogen bond.

3. A composition as in claim 1, wherein the activated surface of the inorganic carrier includes a high surface area porous surface, and the catalyst is sorbed on at least a portion of the activated surface.

4. A composition as in claim 1, wherein the inorganic carrier is selected from the group consisting of silica, alumina, aluminosilicate, aluminum trihydrate, silicon nitride, clay, talc, mica, kaolin, calcium carbonate, wollastonite, montmorillonite, smectite, and combinations thereof.

5. A composition as in claim 1, wherein the catalyst of c)ii) is selected from the group consisting of nitrogen-containing compounds, phenyl-containing compounds, and combinations thereof.

6. A composition as in claim 5, wherein the nitrogen-containing compound is selected from the group consisting of amine compounds, amide compounds, imidazole compounds, and combinations thereof.

7. A composition as in claim 6, wherein the nitrogen-containing compound is 1,8-diazobicyclo(5.4.0)undecene-7.

8. A composition as in claim 5, wherein the phenyl-containing compound is triphenyl phosphine.

9. A composition as in claim 1, wherein the epoxy resin is selected from the group consisting of bisphenol A type epoxy resins, novolac type epoxy resins, alicyclic epoxy resins, glycidyl type epoxy resins, biphenyl type epoxy resins, naphthalene ring-containing epoxy resins, cyclopentadiene-containing epoxy resins, polyfunctional epoxy resins, and combinations thereof.

10. A composition as in claim 1, wherein the curing agent is selected from the group consisting of phenol novolac hardener, cresol novolac hardener, dicyclopentadiene phenol hardener, limonene type hardener, anhydrides, and combinations thereof.

11. A composition as in claim 1, further comprising a bulk amount of an inorganic filler component.

12. A composition as in claim 11, wherein the inorganic filler component is selected from the group consisting of silica, alumina, aluminosilicate, aluminum trihydrate, silicon nitride, clay, talc, mica, kaolin, calcium carbonatewollastonite, montmorillonite, smectite, and combinations thereof., 13. A composition as in claim 11, wherein the inorganic filler component and the inorganic carrier of the curative comprise the same compound.

14. A composition as in claim 11, wherein both the inorganic filler component and the inorganic carrier of the curative are silica.

15. A composition as in claim 1, further comprising a component selected from the group consisting of mold release agents, adhesion promoters, coupling agents, colorants, flame retardants, ion scavengers, and combinations thereof.

16. An electronic packaging material comprising a reaction product of the composition of claim 1.

17. An encapsulated semiconductor device, wherein the encapsulant material is formed from a reaction product of the composition of claim 1.

18. An epoxy molding composition comprising:
  a) from about 5 to about 30 weight percent, based on the total weight of the composition, of an epoxy resin;
  b) from about 0 to about 30 weight percent, based on the total weight of the composition, of a curing agent for the epoxy resin;
  c) from about 0.1 to about 10 weight percent, based on the total weight of the composition, of a latent curative complex comprising a catalyst compound having a at least one moiety capable of accelerating curing of the epoxy resin, said at least one moiety being at least partially deactivated by combining the catalyst compound prior to combination with the epoxy resin with an inorganic carrier, at least a portion of whose surface has been activated; and
  d) from about 50 to about 95 weight percent, based on the total weight of the composition, of a filler component.

19. An epoxy molding compound as in claim 18, wherein the inorganic carrier and the filler component comprise the same compound.

20. An epoxy molding compound as in claim 18, wherein the inorganic carrier and the filler component are independently selected from the group consisting of silica, alumina, aluminosilicate, aluminum trihydrate, silicon nitride, clay, talc, mica, kaolin, calcium carbonate, wollastonite, montmorillonite, smectite, and combinations thereof.

21. An epoxy molding compound as in claim 20, wherein both the inorganic carrier and the filler component are silica.

22. An epoxy molding compound as in claim 18, wherein the catalyst compound is selected from the group consisting of nitrogen-containing compounds, phenyl-containing compounds, and combinations thereof.

23. An epoxy molding compound as in claim 22, wherein the nitrogen-containing compound is selected from the group consisting of amine compounds, amide compounds, imidazole compounds, and combinations thereof.

24. An epoxy molding compound as in claim 23, wherein the nitrogen-containing compound is 1,8-diazobicyclo(5.4.0)undecene-7.

25. An epoxy molding compound as in claim 22, wherein the phenyl-containing compound is triphenyl phosphine.

26. An epoxy molding compound as in claim 18, wherein the epoxy resin is selected from the group consisting of bisphenol A type epoxy resins, novolac type epoxy resins, alicyclic epoxy resins, glycidyl type epoxy resins, biphenyl type epoxy resins, naphthalene ring-containing epoxy resins, cyclopentadiene-containing epoxy resins, polyfunctional epoxy resins, and combinations thereof.

27. An epoxy molding compound as in claim 18, wherein the curing agent is selected from the group consisting of phenol novolac hardener, cresol novolac hardener, dicyclopentadiene phenol hardener, limonene type hardener, anhydrides, and combinations thereof.

28. An epoxy molding compound as in claim 18, further comprising one or more components selected from the group consisting of mold release agents, adhesion promoters, coupling agents, colorants, flame retardants, ion scavengers, and combinations thereof.

29. A curative for accelerating the cure of an epoxy resin comprising the combination of an inorganic carrier at least a portion of whose surface has been activated and a catalyst compound selected from the group consisting of nitrogen-containing compounds and phenyl-containing compounds, wherein the catalyst compound includes moieties, at least a portion of which are at least partially deactivated through combination of the catalyst with the inorganic carrier having an activated surface.

30. A curative as in claim 29, wherein the activated surface of the inorganic carrier comprises a high surface area porous surface including reactive surface groups capable of bonding to the catalyst compound through a hydrogen bond.

31. A curing complex comprising at least a partial reaction product of the curative of claim 29.

32. A curative as in claim 29, wherein the inorganic carrier is selected from the group consisting of silica, alumina, aluminosilicate, aluminum trihydrate, silicon nitride, clay, talc, mica, kaolin, calcium carbonate, wollastonite, montmorillonite, smectite, and combinations thereof.

33. A curative as in claim 29, wherein the nitrogen-containing compound is selected from the group consisting of amine compounds, amide compounds, imidazole compounds, and combinations thereof.

34. A curative as in claim 29, wherein the inorganic carrier is silica and the nitrogen-containing compound is 1,8-diazobicyclo(5.4.0)undecene-7.

35. A curative as in claim 29, wherein the inorganic carrier is silica and the phenyl-containing compound is triphenyl phosphine.

36. A process for preparing a curative for an epoxy resin comprising:
  a) activating at least a portion of the surface of an inorganic carrier;
  b) combining the inorganic carrier with a catalyst compound having reactive moieties for accelerating the cure of the epoxy resin; and
  c) drying the inorganic carrier.

37. A process as in claim 36, wherein the activating step a) comprises removing water from the surface.

38. A process as in claim 36, wherein the activating step a) comprises heating the surface under vacuum.

39. A process as in claim 36, wherein the combining step b) comprises reacting the inorganic carrier with the catalyst compound to form a complex, with at least a portion of the moieties of the catalyst compound bonded to the inorganic carrier through a hydrogen bond.

40. A process as in claim 39, wherein the catalyst compound comprises a nitrogen-containing catalyst, and wherein at least a portion of the nitrogen atoms of the nitrogen-containing catalyst are bonded to the inorganic-based carrier through a hydrogen bond to form an acid-base complex.

41. A latent curative complex for accelerating the cure of an epoxy resin comprising a catalyst having a moiety capable of accelerating curing of the epoxy resin and an inorganic carrier which has been heated to a temperature of at least about 100° C. for at least 1 hour.

42. A latent curative complex as in claim 41, wherein the inorganic carrier exhibits a loss of weight during such heating prior to being combined with the catalyst.

43. A latent curative complex as in claim 41, wherein the heating of the inorganic carrier removes labile water molecules from at least a portion of the surface of the inorganic carrier.

* * * * *

UNITED STATES PATENT AND TRADEMARK OFFICE
CERTIFICATE OF CORRECTION

PATENT NO. : 6,822,341 B1
DATED : November 23, 2004
INVENTOR(S) : Ahsan

It is certified that error appears in the above-identified patent and that said Letters Patent is hereby corrected as shown below:

Column 12,
Line 66, "carbonatewollastonite" should read -- carbonate, wollastonite --.
Line 67, "thereof.," should read -- thereof. --.

Column 13,
Line 24, "a at" should read -- at --.

Signed and Sealed this

Tenth Day of May, 2005

JON W. DUDAS
*Director of the United States Patent and Trademark Office*